(12) United States Patent
O'Leary et al.

(10) Patent No.: US 10,638,631 B2
(45) Date of Patent: Apr. 28, 2020

(54) COMPLIANT MICRO LATCH FOR HIGH-SPEED SIGNAL SUB-SLOT PLUGGABLE MODULES

(71) Applicant: Ciena Corporation, Hanover, MD (US)

(72) Inventors: Mitchell O'Leary, Ottawa (CA); Victor Aldea, Ottawa (CA); Trevor Meunier, Kemptville (CA); Kamran Rahmani, Kanata (CA); Yannick Brisebois, Carp (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/140,609

(22) Filed: Sep. 25, 2018

(65) Prior Publication Data

US 2020/0100379 A1    Mar. 26, 2020

(51) Int. Cl.
*H05K 7/00* (2006.01)
*H05K 7/14* (2006.01)
*H05K 5/00* (2006.01)

(52) U.S. Cl.
CPC ......... *H05K 7/1409* (2013.01); *H05K 7/1452* (2013.01); *H05K 5/0026* (2013.01); *H05K 7/1417* (2013.01)

(58) Field of Classification Search
None
See application file for complete search history.

(56) References Cited

U.S. PATENT DOCUMENTS

| | | | |
|---|---|---|---|
| 4,840,570 A * | 6/1989 | Mann, Jr. | H05K 7/1409 361/787 |
| 5,402,320 A | 3/1995 | Kielstra et al. | |
| 5,949,946 A | 9/1999 | Debortoli et al. | |
| 5,993,251 A | 11/1999 | Brown et al. | |
| 6,252,514 B1 * | 6/2001 | Nolan | G06F 1/183 340/686.4 |
| 6,421,252 B1 * | 7/2002 | White | H05K 7/1429 174/377 |
| D486,454 S | 2/2004 | Vink-Ellis et al. | |
| 6,831,844 B1 | 12/2004 | Lee et al. | |
| 6,948,968 B1 | 9/2005 | Shearman et al. | |
| 7,023,704 B1 | 4/2006 | Zarnowitz et al. | |

(Continued)

*Primary Examiner* — Courtney L Smith
*Assistant Examiner* — Rashen E Morrison
(74) *Attorney, Agent, or Firm* — Clements Bernard Walker Law; Christopher L. Bernard; Lawrence A. Baratta, Jr.

(57) ABSTRACT

A module includes a physical form factor with one or more openings in a faceplate for receiving a corresponding sub-slot module; module high-speed connectors configured to mate with high-speed connectors in the corresponding sub-slot module; and one or more micro latches for each of the one or more openings to engage a compliant faceplate insert on the corresponding sub-slot module, wherein a single micro latch is utilized to engage a single sub-slot module to provide built-in physical compliancy with a biasing force sufficient to engage the high-speed connectors with the module high-speed connectors. Each of the one or more micro latches includes a latching pin which engages an integrated channel in the compliant faceplate insert on the corresponding sub-slot module and which engages an end of the integrated channel to apply a force to a spring on the compliant faceplate insert.

20 Claims, 13 Drawing Sheets

(56) References Cited

U.S. PATENT DOCUMENTS

| | | | |
|---|---|---|---|
| 7,684,208 B2* | 3/2010 | Okamoto | H05K 7/1487 |
| | | | 361/754 |
| 8,052,335 B2 | 11/2011 | Kasbeer-Betty et al. | |
| 9,295,178 B1 | 3/2016 | Aldea et al. | |
| 9,759,235 B2 | 9/2017 | Saturley et al. | |
| 10,028,407 B2 | 7/2018 | Meunier et al. | |
| 10,062,993 B1 | 8/2018 | Lutkiewicz et al. | |
| 2002/0135987 A1* | 9/2002 | Baldwin | H05K 7/142 |
| | | | 361/730 |
| 2003/0185537 A1 | 10/2003 | O'Leary et al. | |
| 2008/0239689 A1* | 10/2008 | Okamoto | H05K 7/1487 |
| | | | 361/807 |
| 2017/0244211 A1 | 8/2017 | Lee et al. | |

* cited by examiner

COMPLIANT MICRO LATCH FOR HIGH-SPEED SIGNAL SUB-SLOT PLUGGABLE MODULES

FIELD OF THE DISCLOSURE

The present disclosure generally relates to networking hardware. More particularly, the present disclosure relates to a compliant micro latch for high-speed signal sub-slot pluggable modules, such as pluggable optical modules which are inserted into other modules in a network element chassis.

BACKGROUND OF THE DISCLOSURE

Networking equipment such as routers, switches, cross-connects, Wavelength Division Multiplexing (WDM) terminals, etc. are realized generally through chassis (shelves) with modules which are selectively inserted for realizing various functions (e.g., optical ingress/egress, switching, control, etc.). Further, optical transceivers are being realized in so-called pluggable modules which are configured to insert into another module. Other types of sub-slot modules are also being used. As described herein, a module, circuit pack, card, blade, etc. are collectively referred to as a module. The module can support sub-slot pluggable modules, such as optical transceivers or the like. Conventionally, sub-slot pluggable modules include latches on the faceplate of the sub-slot pluggable modules. This approach takes significant real estate but is required to provide the appropriate mating force so that the sub-slot pluggable module is compliant, i.e., properly engages pins in the module. Conventional attempts at reducing the size of the latch or moving the latch to the module itself instead of the sub-slot pluggable module do not provide physical compliance to take up assembly tolerances i.e., are non-compliant. As described herein, physical compliance refers to a biasing force which is applied to take up assembly tolerances such that the modules interfaces properly mate with corresponding interfaces on a host device or module. With the high-speeds of these sub-slot pluggable modules, it is important to provide a compliant latching solution, but there is a need to reduce the real estate supporting higher density platforms which reduces the ability to provide the biasing force.

BRIEF SUMMARY OF THE DISCLOSURE

In an embodiment, a module includes a physical form factor with one or more openings in a faceplate for receiving a corresponding sub-slot module; module high-speed connectors configured to mate with high-speed connectors in the corresponding sub-slot module; and one or more micro latches for each of the one or more openings to engage a compliant faceplate insert on the corresponding sub-slot module, wherein a single micro latch is utilized to engage a single sub-slot module to provide physical compliancy with a biasing force sufficient to engage the high-speed connectors with the module high-speed connectors. Each of the one or more micro latches can include a latching pin which engages an integrated channel in the compliant faceplate insert on the corresponding sub-slot module and which engages an end of the integrated channel to apply a force to a spring on the compliant faceplate insert. The spring on the compliant faceplate insert can be a cantilever beam spring. Each of the one or more micro latches can include a thumbscrew which engages a threaded insert in the faceplate of the module for locking the corresponding micro latch in place. Each of the one or more micro latches can include a torsion spring and a hard stop which keeps the corresponding micro latch open to about a 45-degree angle relative to the faceplate in an open position. The force can be at least 40 lbs such that the engagement of the high-speed connectors with the module high-speed connectors are fully mated and can accommodate a physical compliancy of ±0.030". Each of the one or more micro latches can be stainless steel. Each of the one or more micro latches can extend out no more than about 0.5" from the faceplate in a closed position and wherein each of the one or more micro latches can have a length of about 1.75".

In another embodiment, a network element system includes a shelf configured to receive a plurality of modules; a module of the plurality of modules; and a sub-slot module configured to operate in the module, wherein the module includes a physical form factor with an opening in a faceplate for receiving the sub-slot module; module high-speed connectors configured to mate with high-speed connectors in the sub-slot module; and a micro latch for the opening to engage a compliant faceplate insert on the sub-slot module, wherein the micro latch is a single latch utilized to engage the sub-slot module to provide physical compliancy with a biasing force sufficient to engage the high-speed connectors with the module high-speed connectors. The micro latch can include a latching pin which engages an integrated channel in the compliant faceplate insert on the sub-slot module and which engages an end of the integrated channel to apply a force to a spring on the compliant faceplate insert. The spring on the compliant faceplate insert can be a cantilever beam spring. The micro latch can include a thumbscrew which engages a threaded insert in the faceplate of the module for locking the micro latch in place. The micro latch can include a torsion spring and a hard stop which keeps the micro latch open to about a 45-degree angle relative to the faceplate in an open position. The force can be at least 40 lbs such that the engagement of the high-speed connectors with the module high-speed connectors are fully mated and can accommodate a physical compliancy of ±0.030". The micro latch can be stainless steel. The micro latch can extend out no more than about 0.5" from the faceplate in a closed position and wherein each of the one or more micro latches can have a length of about 1.75".

In a further embodiment, a method includes obtaining a module that includes a physical form factor with an opening in a faceplate, module high-speed connectors, and a micro latch for the opening; inserting a sub-slot module into the opening, wherein the sub-slot module includes compliant faceplate insert and high-speed connectors; engaging an integrated channel on the compliant faceplate insert with a latching pin on the micro latch; and closing the micro latch such that the latching pin engages an end of the integrated channel to provide physical compliancy with a biasing force sufficient to engage the high-speed connectors with the module high-speed connectors. The micro latch can include a thumbscrew which engages a threaded insert in the faceplate of the module for locking the corresponding micro latch in place. The micro latch can include a torsion spring and a hard stop which keeps the micro latch open to about a 45-degree angle relative to the faceplate in an open position. The force can be at least 40 lbs such that the engagement of the high-speed connectors with the module high-speed connectors are fully mated and can accommodate a physical compliancy of ±0.030".

BRIEF DESCRIPTION OF THE DRAWINGS

The present disclosure is illustrated and described herein with reference to the various drawings, in which like reference numbers are used to denote like system components/ method steps, as appropriate, and in which.

DETAILED DESCRIPTION OF THE DISCLOSURE

In various embodiments, the present disclosure relates to a compliant micro latch for high-speed signal sub-slot pluggable modules, such as pluggable optical modules which are inserted into other modules in a network element chassis. A micro compliant latch of such a design is a significant challenge to design in the limited space of a sub-slot module. The present disclosure provides limited size and compactness in a single micro latch while providing a compliant latch. As described herein, a compliant latch is one that provides adequate mating force and with built in physical compliancy such that the sub-module makes proper contact with associated pins in a module such as to account for a range of assembly tolerances. Typical compliant latch systems require two latches on either end of a mating module with 90 degrees or greater range of motion into two mating troughs on the mating system and long lever arm in order to latch and apply ~50 lbs of force. The design of this compliant micro latch makes use of a single centrally mounted latch with a smaller lever arm (requiring less than half the physical real estate of a typical latch). The micro latch itself only requires a 45-degree range of motion to function and can apply ~40 lbs of force. The micro latch spring is made from high strength stainless steel to prevent yielding and to provide a scratch resistant surface.

Figure 1:
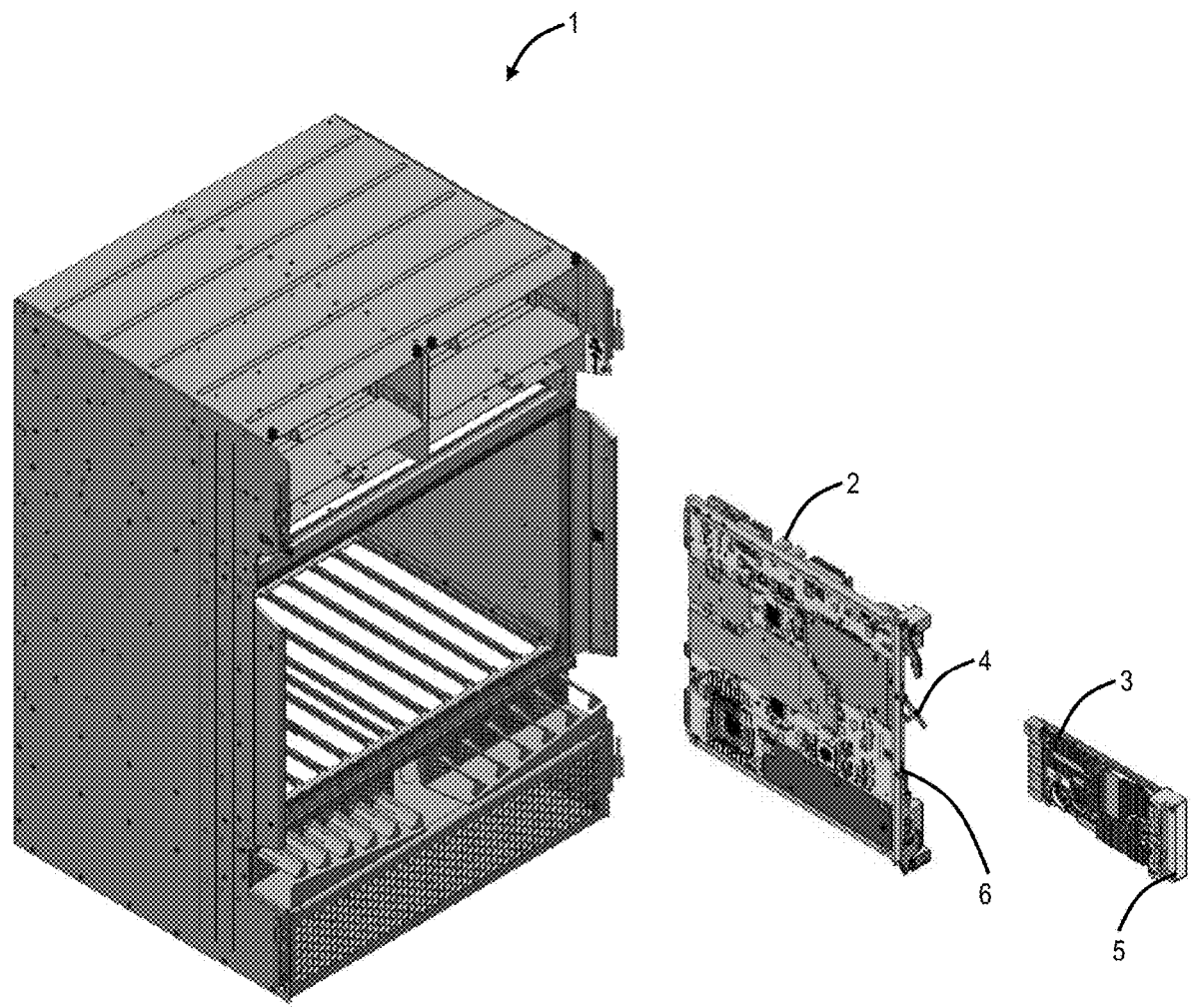
FIG. 1 is a perspective diagram of a network element shelf with an example module and a sub-slot module.

FIG. 1 is a perspective diagram of a network element shelf 1 with an example module 2 and a sub-slot module 3. Again, the network element shelf 1 can form a network element such as a router, switch, cross-connect, WDM terminal, etc. The module 2 can be a line card, switch card, etc. The module 2 is configured to insert into the network element shelf 1. The sub-slot module 3 is configured to insert into the module 2. The sub-slot module 3 can be an optical transceiver or modem such as C Form-factor Pluggable (CFP) and variants thereof, a Quad Small Form-factor Pluggable (QSFP) and variants thereof, an Octal Small Format Pluggable (OSFP) and variants thereof, as well as vendor-specific implementations, and the like.

The module 2 includes one or more slots for receiving one or more sub-slot modules 3 and a micro latch 4 for each of the one or more slots. The sub-slot modules 3 have a compliant faceplate insert 5 without a latch. The micro latch 4 is configured to lock the corresponding sub-slot module 3 with compliant force. The micro latch 4 is small and uses minimal faceplate 6 real estate. The micro latch 4 incorporates a non-conventional approach of latching the sub-slot module 3. The compliant faceplate insert 5 enables the micro latch 4, i.e., a single latch, to provide the force and compliancy to ensure sufficient mating of high-speed connectors 21, 22 (electrical connectivity) between the module 2 and the sub-slot module 3.

Again, the compliant micro latch 4 mechanism is used to fully mate a customer swappable, sub-slot module 3 within the module 2, which is then mated to a network element shelf 1. This includes an unconventional micro latch 4 mounted on the faceplate 6 of the mating circuit pack module 2 and a high strength compliant faceplate insert 5 mounted on the faceplate of the sub-slot module 3 with integrated channels 16 for the micro latch 4 to mate (mechanically engage) with as well as integrated compliant springs 17 such as integrated, compliant, cantilever beam springs.

Figure 2:
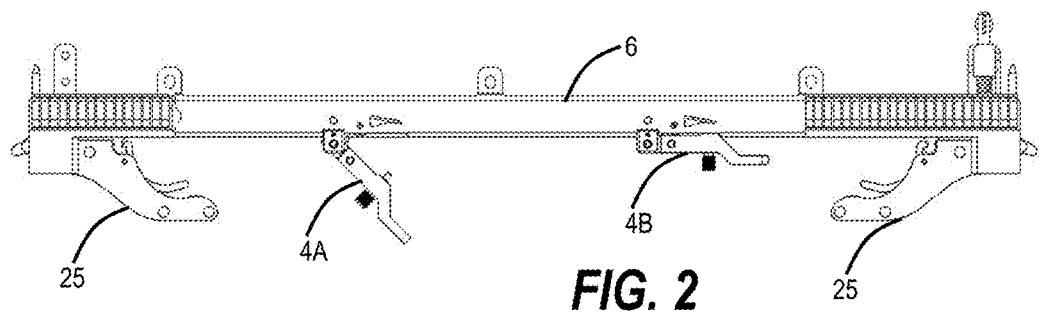
FIG. 2 is a side view diagram of a faceplate of the module with two micro latches.
Figure 3:
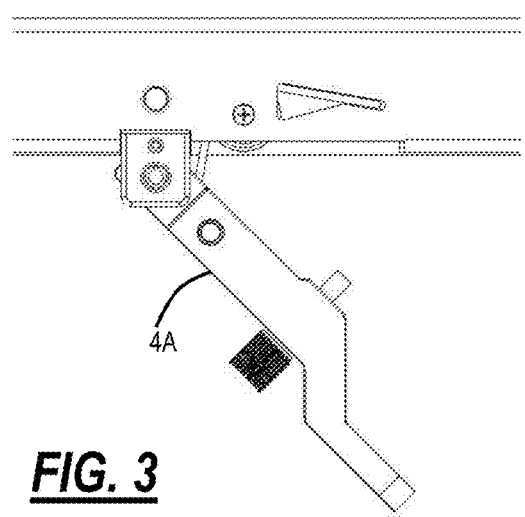
FIG. 3 is a close-up side view diagram of a micro latch in an open position.
Figure 4:
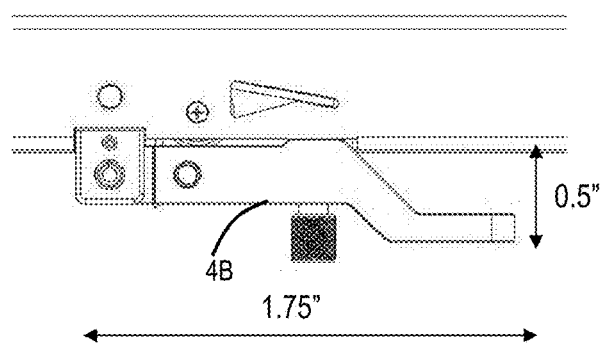
FIG. 4 is a close-up side view diagram of a micro latch in a closed position.
Figure 5:
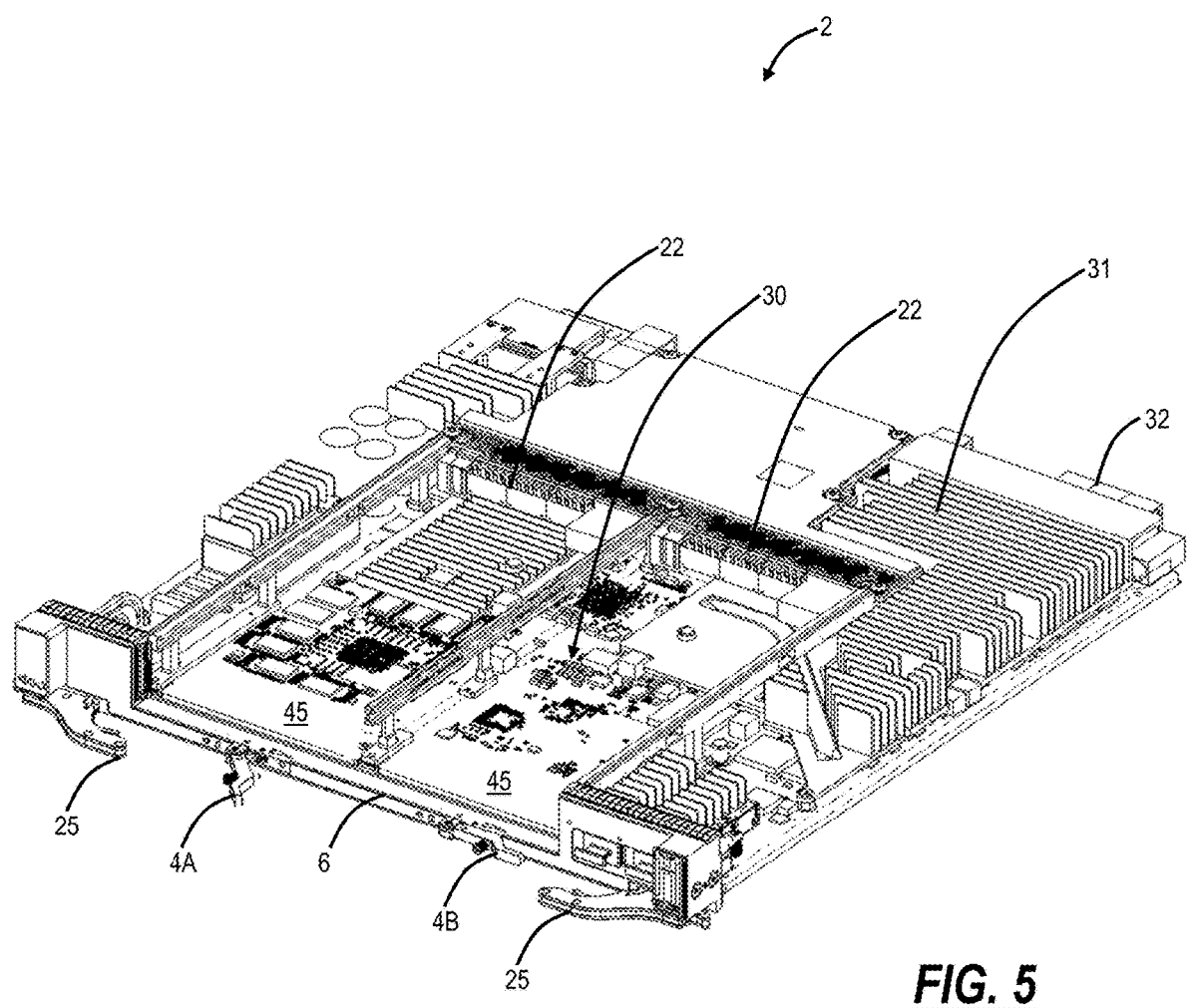
FIG. 5 is a perspective diagram of the module supporting two sub-slot modules which are unequipped.
Figure 6:
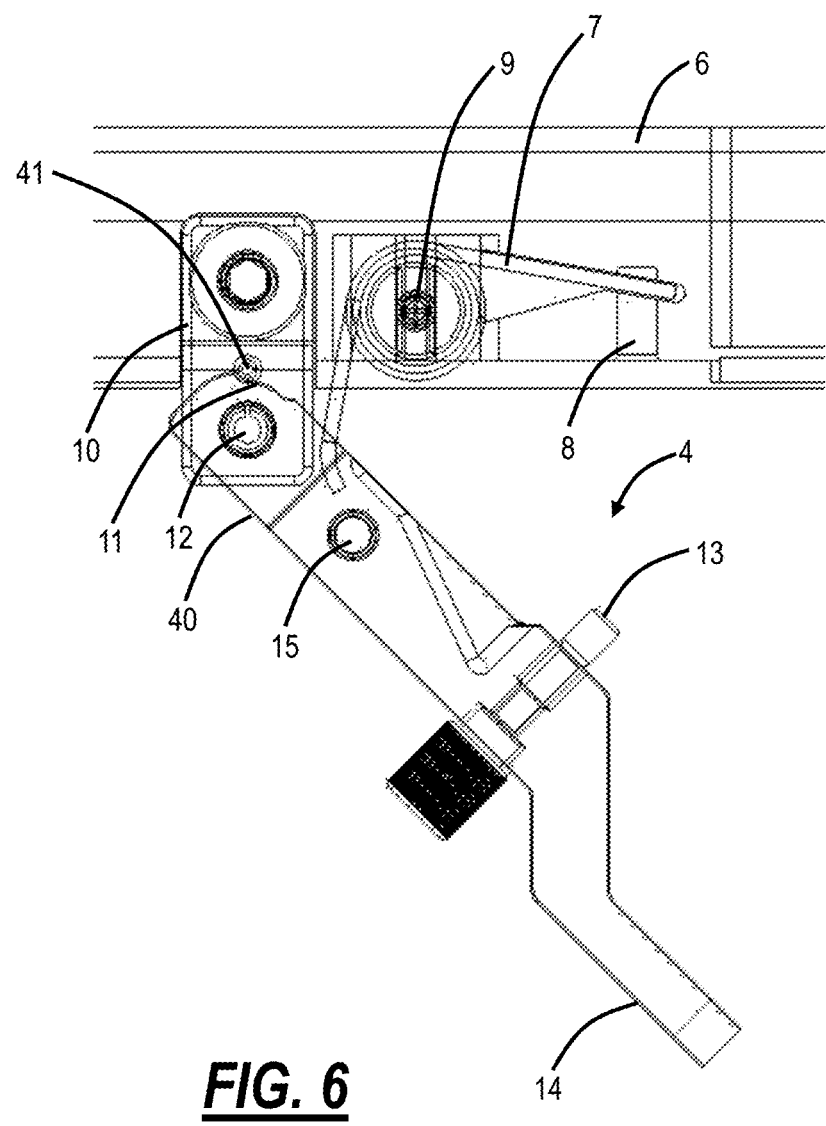
FIG. 6 is a diagram of components of the micro latch with the micro latch in the open position.
Figure 7:
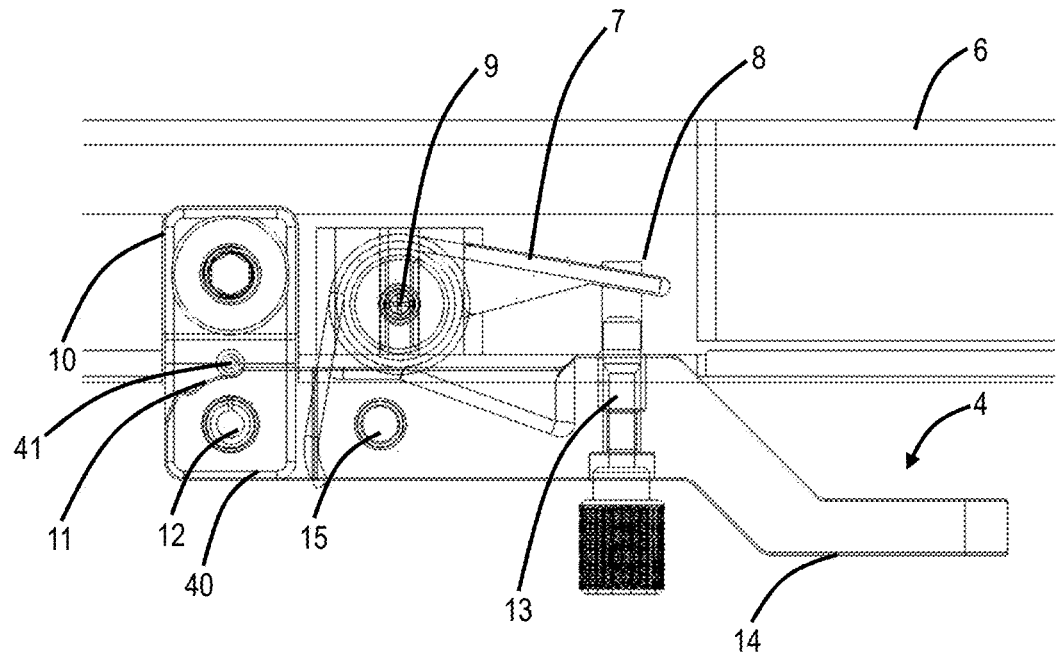
FIG. 7 is a diagram of components of the micro latch with the micro latch in the closed position.
Figure 8:
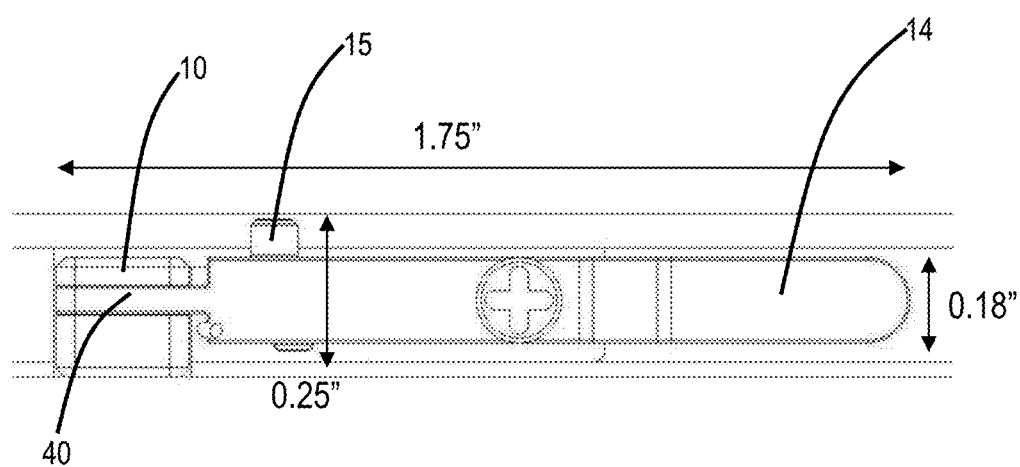
FIG. 8 is a front view diagram of the micro latch.

FIG. 2 is a side view diagram of a faceplate 6 of the module 2 with two micro latches 4. FIG. 3 is a close-up side view diagram of a micro latch 4 in an open position. FIG. 4 is a close-up side view diagram of a micro latch 4 in a closed position. FIG. 5 is a perspective diagram of the module 2 supporting two sub-slot modules 3 which are unequipped (not shown). FIG. 6 is a (partially see through of FIG. 3) diagram of components of the micro latch 4 with the micro latch 4 in the open position. FIG. 7 is a (partially see through of FIG. 3) diagram of components of the micro latch 4 with the micro latch 4 in the closed position. FIG. 8 is a front view diagram of the micro latch 4B corresponding to FIGS. 4, 7.

Figure 9:
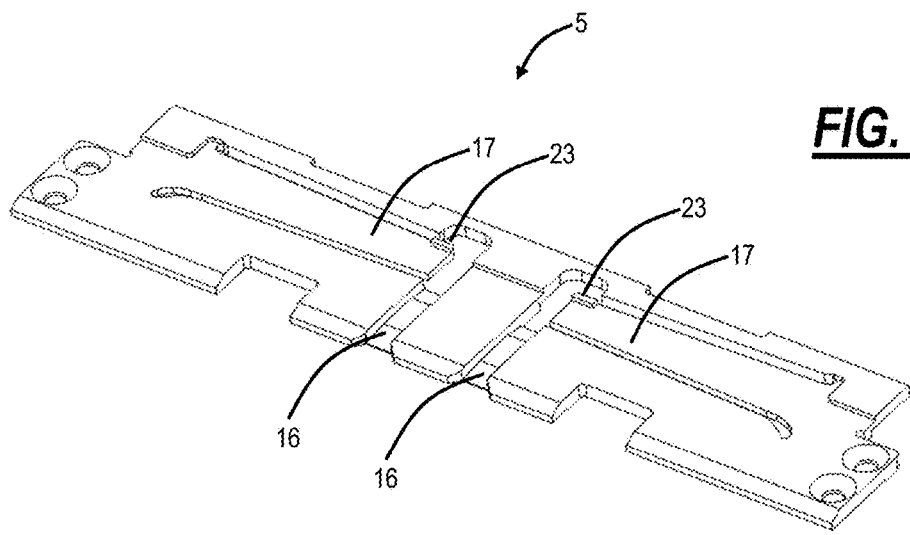
FIG. 9 is a perspective diagram of the compliant faceplate insert.
Figure 10:
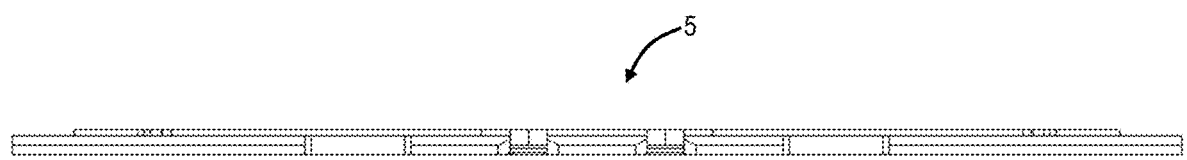
FIG. 10 is a front view diagram of the compliant faceplate insert.
Figure 11:
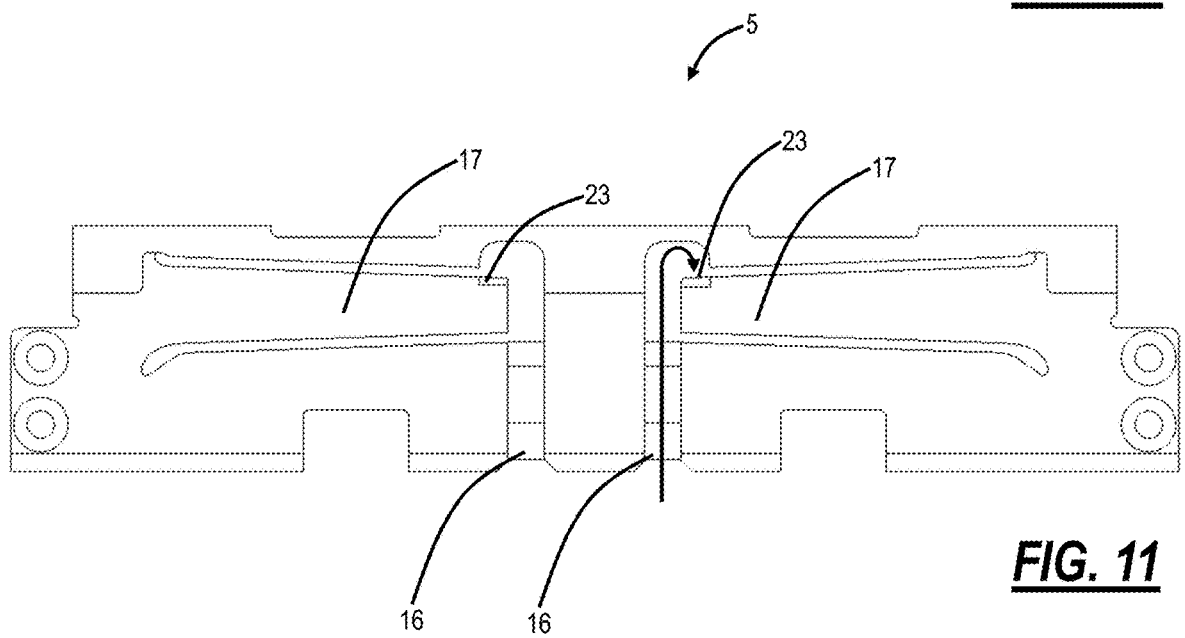
FIG. 11 is a top view diagram of the compliant faceplate insert.
Figure 12:
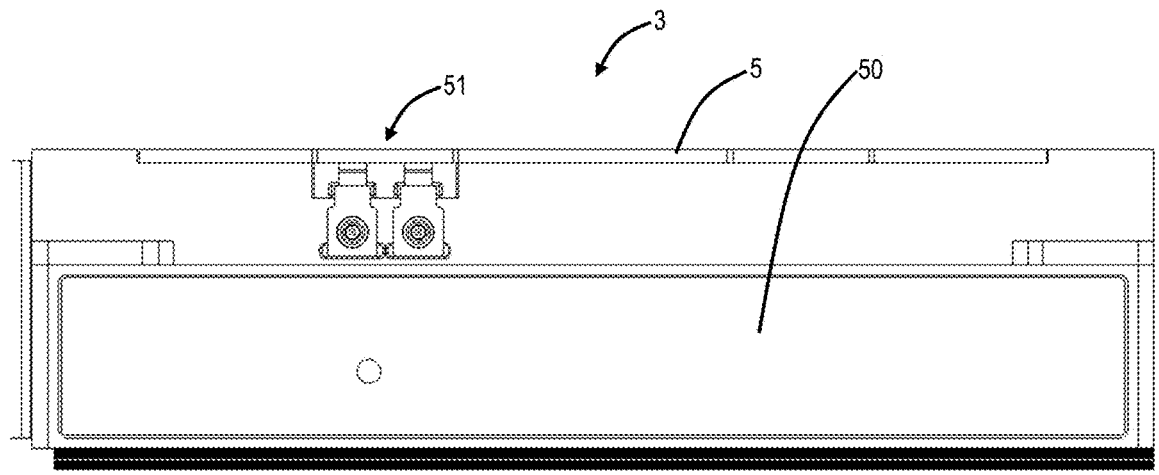
FIG. 12 is a front view diagram of the compliant faceplate insert on the sub-slot module.
Figure 13:
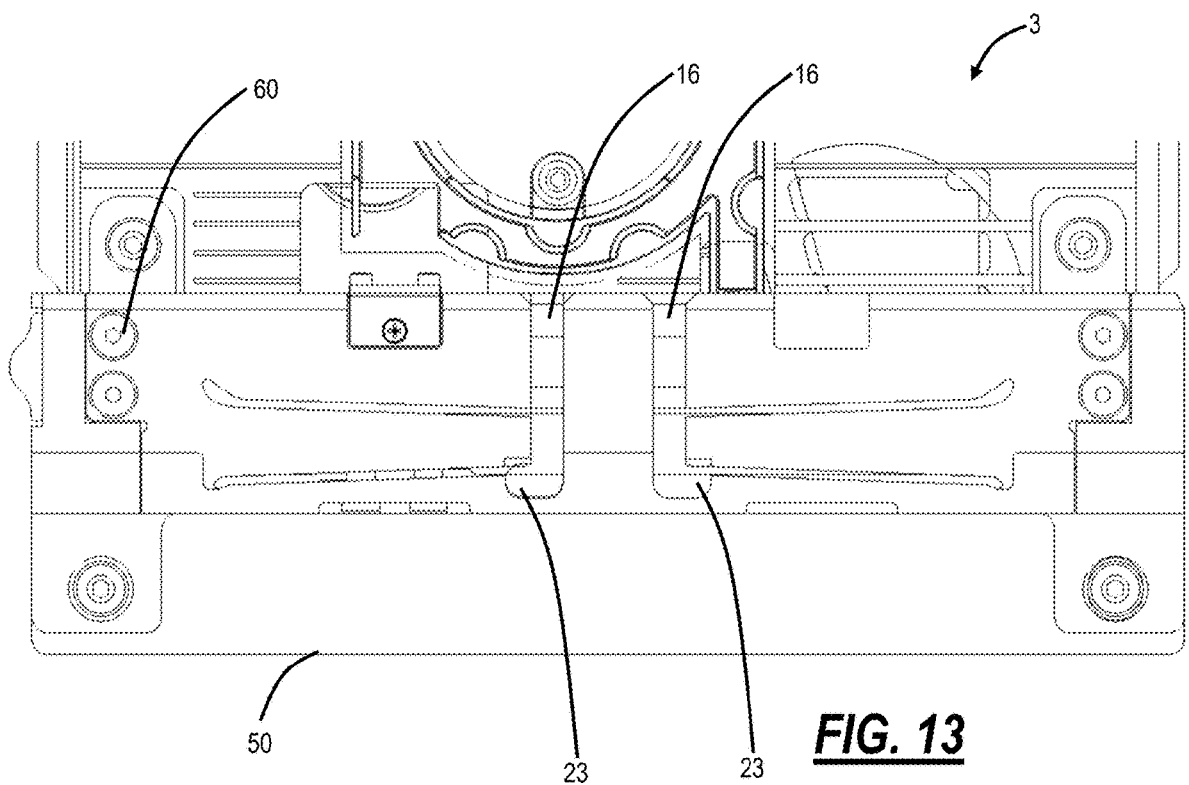
FIG. 13 is a top view diagram of the compliant faceplate insert on the sub-slot module.
Figure 14:
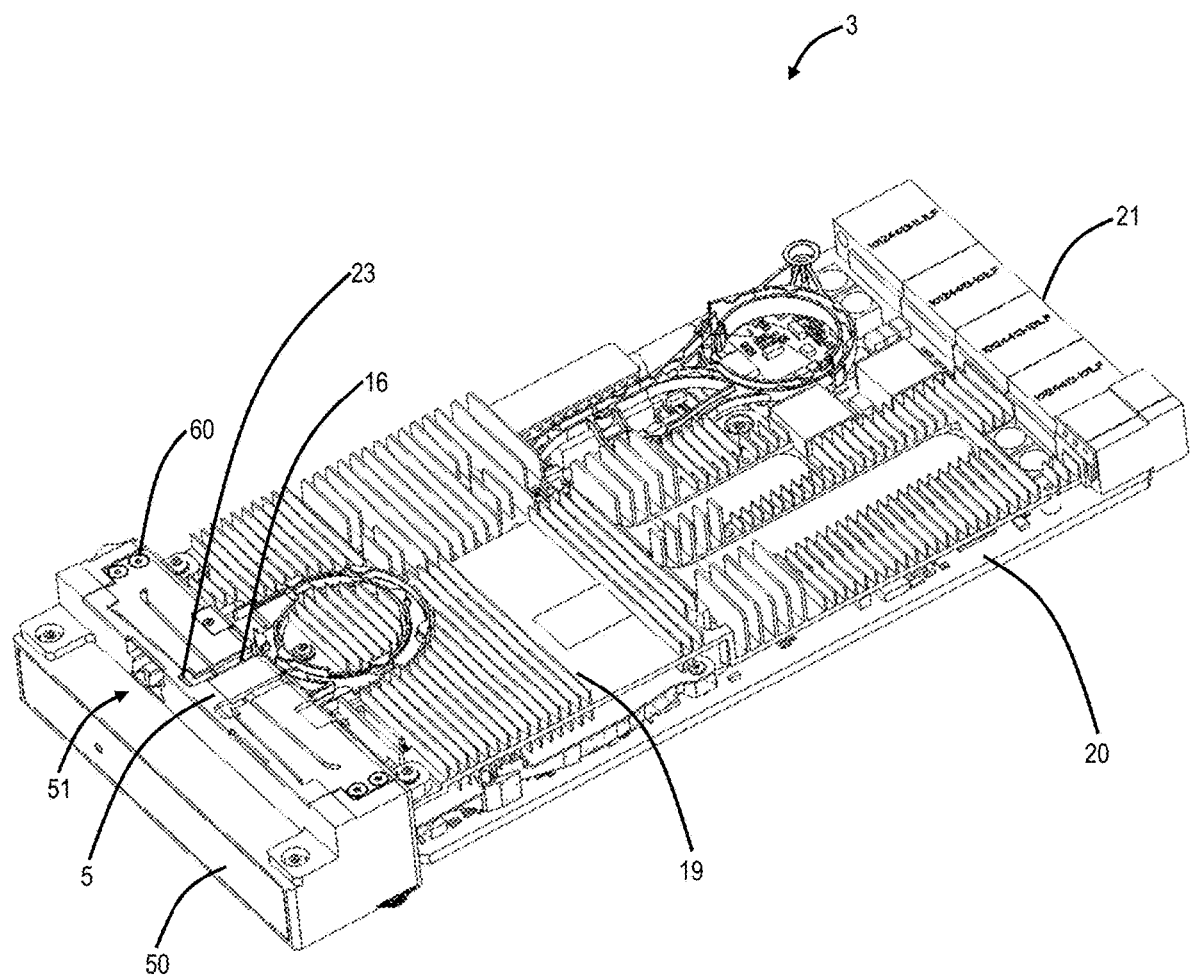
FIG. 14 is a perspective diagram of the sub-slot module.

In addition to the micro latch 4 on the faceplate 6 of the module, the sub-slot module 3 includes the compliant faceplate insert 5. FIG. 9 is a perspective diagram of the compliant faceplate insert 5, FIG. 10 is a front view diagram of the compliant faceplate insert 5, and FIG. 11 is a top view diagram of the compliant faceplate insert 5. FIG. 12 is a front view diagram of the compliant faceplate insert 5 mounted on the sub-slot module 3. FIG. 13 is a top view diagram of the compliant faceplate insert 5 mounted on the sub-slot module 3. FIG. 14 is a perspective diagram of the sub-slot module 3.

By adding the ability for the micro latch 4 to be compliant within the limited space available, this design makes the use of high-performance modems within a swappable, sub-slot form factor possible, using the required advanced interconnect systems. Prior to this design, such a configuration was not possible. Additionally, the compliant faceplate insert 5 can be removed and fixed integrated channels 16 may be added to the sub-slot module 3 faceplate and used instead for lower speed or less critical mating systems that do not require fully complete mating, in order to save cost and reduce complexity (also as compared to a typical standard latching system which makes use of two latches and requires external troughs, as compared to one latch and one integrated channel 16 for this design).

The approach described herein includes two parts, namely the micro latch 4 and the compliant faceplate insert 5. In FIGS. 1-8, the single micro latch 4 mounts on the module 2 or the network element shelf 1 (not the assembled module as typical) which makes use of a latching pin 15 on the micro latch 4 with a constrained range of motion (11). The latching pin 15 on a latch lever 14 interacts with integrated channels 16 on the mating sub-slot module 3 (FIGS. 16, 17). A torsion spring 7 keeps the micro latch 4 open at the hard stop (11) (FIG. 6) such that the latching pin 15 correctly aligns with the integrated channel 16 of the compliant faceplate insert 5 when the sub-slot module 3 is inserted into the module 2 (FIGS. 15-18).

The latching system includes various mechanical components. In FIG. 2, 5, the module 2 supports two sub-slot modules 3 and thus includes two micro latches 4 (labeled as 4A, 4B). In the example of FIG. 2, the micro latch 4A is open whereas the micro latch 4B is closed. Note, the micro latches 4A, 4B are structurally and functionally identical but referenced differently as the micro latch 4A is open whereas the micro latch 4B is closed solely for illustration purposes herein. In addition to the micro latches 4A, 4B, the module 2 includes two other latches 25 for engaging the module 2 in the network element shelf 1. The latches 25 are included at the top and the bottom of the faceplate 6 (note, FIG. 6 is a side view facing downward).

FIGS. 3 and 4 illustrate close up views of the micro latches 4A, 4B, respectively. FIG. 8 illustrates a front view of the micro latch 4B, i.e., in the closed position. In an embodiment, the dimensions of the micro latch 4 can include a height of about 1.75" and a width of 0.25" or less. Further, the micro latch 4B in the closed position can extend out from the faceplate 6 by no more than 0.5". The micro latch 4A in the open position can open at no more than 45 degrees. Accordingly, the micro latch 4A, 4B is compact from the perspective of size relative to the faceplate 6.

FIG. 5 illustrates the module 2 which supports two of the sub-slot modules 3. Again, the module 2 can include a line module, a switch module, etc. For example, the module 2 can be a line module and the sub-slot modules 3 can be optical transceivers. The module 2 includes mating high-speed connectors 22 which mate with corresponding high-speed connectors 21 on the sub-slot module 3 (FIG. 14). Again, the micro latch 4 and the compliant faceplate insert 5 ensure proper (electrical) interconnection between the mating high-speed connectors 22 and the corresponding high-speed connectors 21. Additionally, the module 2 can include various electronic (and/or optical) components 30 on a Printed Circuit Board Assembly (PCBA), heat sinks 31, and module high-speed connectors 32 which mate with corresponding mating high-speed connectors on a backplane in the network element shelf 1 (not shown).

The module 2 includes a physical form factor with one or more openings 45 in the faceplate 6 to receive corresponding sub-slot modules 3. The physical form factor can include the various electronic and/or optical components 30 on the PCBA, the heat sinks 31, the module high-speed connectors 32 and the like.

FIGS. 6, 7, and 8 illustrate various components of the micro latch 4. Specifically, FIGS. 6 and 7 illustrate (see through) internal components of the micro latch 4 behind the faceplate 6 with FIG. 6 illustrating the micro latch 4 in the open position and FIG. 7 illustrating the micro latch 4 in the closed position. The micro latch 4 includes a torsion spring 7 which applies a force on a latch lever 14 to bias the latch lever 14 (FIG. 6). The torsion spring 7 connects to the faceplate 6 via a pin 9. The faceplate 6 includes a threaded insert 8 which is configured to receive a captive thumbscrew 13 on the latch lever 14. The captive thumbscrew 13 is screwed into the threaded insert 8 (FIG. 7) to lock the micro latch 4 once the sub-slot module 3 is inserted.

A bracket 10 connects an end 40 of the micro latch 4 opposite from the latch lever 14 to the faceplate 6. A rotation pin 12 rotatably connects the end 40 to the bracket 10. The end 40 can include a groove to constrain the range of motion of the micro latch lever 14 by providing a hard stop 11. For example, a pin 41 can engage the groove on the end 40 to provide a hard stop 11 of the latch lever 14 at approximately 45 degrees in FIG. 6.

A latching pin 15 is located on the micro latch 4 and is configured to engage channel 16 on the sub-slot module 3. For example, the integrated channel 16 can be provided on the compliant faceplate insert 5.

In FIGS. 9-14, the compliant faceplate insert 5 is formed by a thin (e.g., 2 mm thick) high strength compliant material, such as aluminum, which is disposed on the sub-slot module 3. The compliant faceplate insert 5 allows the above micro latch 4 system, or another style of latch or mating system, to be compliant to take up system tolerances while also allowing sufficient force to sufficiently mate the mating high-speed connectors 22 and the corresponding high-speed connectors 21.

Note, the compliant faceplate insert 5 is illustrated with two integrated channels 16, but only one is used in operation, based on the orientation of the micro latch 4 system, i.e., whether in opens left-to-right or right-to-left.

Due to the nature of a sub-slot module 3, it is small in size with limited faceplate real estate for mounting components. Additionally, with the advent of higher performance modems such as for the sub-slot modules 3, more advanced interconnect solutions (namely the mating high-speed connectors 22 and the corresponding high-speed connectors 21) are used to connect these modem assemblies to their respective mating connector, or in the case of the sub-slot module 3, the mating module 2. These more advanced interconnect systems prefer the mating connectors to be mated flush with no nominal gap between connector halves (the mating high-speed connectors 22 and the corresponding high-speed connectors 21). Due to mechanical tolerance stack up between various components, fully complete mating can only be achieved if there is compliance in the system that facilitates the full mating of both halves (the mating high-speed connectors 22 and the corresponding high-speed connectors 21).

This is achieved using integrated compliant springs 17 on the compliant faceplate insert 5, which are used as a bearing surface at an end 23 of the integrated channel 16 for the micro-latch pin 15 to push against and are allowed to deflect a given amount to account for varying tolerance stack up, while also applying a nominal force high enough to mate the two connector halves (the mating high-speed connectors 22 and the corresponding high-speed connectors 21). Specifically, the integrated compliant springs 17 can each be a cantilever beam spring with a force of 40 lbf which is compliant to ±0.030". It is noted that only one integrated compliant spring 17 engages the micro latch pin 15. Two springs 17 are shown for illustration only.

FIGS. 12 and 13 illustrate the sub-slot module 3. Specifically, FIG. 12 illustrates a front elevation view. The sub-slot module 3 includes a faceplate 50 with no latches. The sub-slot module 3 can include optical connectors 51, e.g., one for transmit and one for receive. For example, the optical connectors 51 can be LC type connectors or the like.

In an embodiment, the sub-slot module 3 can be substantially square or rectangular. The compliant faceplate insert 5 can be disposed or attached to a top of the sub-slot module 3 in the front, e.g., near the faceplate 50.

FIG. 13 illustrates a top plane view of a front portion of the sub-slot module 3 with the compliant faceplate insert 5 attached. For example, the compliant faceplate insert 5 can include openings 60 which can receive a screw for attachment to the top of the sub-slot module 3. Alternatively, the compliant faceplate insert 5 can be integrally formed in the sub-slot module 3 or attached through other techniques.

FIG. 14 illustrates a perspective view of the sub-slot module 3 with the compliant faceplate insert 5 attached. For example, the sub-slot module 3 can be an optical transceiver or modem. The sub-slot module 3 can include a heatsink 19, a Printed Circuit Board Assembly (PCBA) 20, and the high-speed connectors 21. The sub-slot module 3 is configured to slot into openings in the module 2 illustrated in FIG. 5.

Again, the compliant faceplate insert 5 is located on the top of the sub-slot module 3 and the integrated channel 16 is configured to engage the latching pin 15 on the micro latch 4. Specifically, the latching pin 15 travels the integrated channel 16 as the sub-slot module 3 is inserted (FIGS. 15-18) in the module 2. The integrated channel 16 has a substantially linear channel portion for receiving the latching pin 15. The end 23 of the integrated channel 16 is a notch which catches the latching pin 15 once the micro latch 4 is in the closed position.

When the latching pin 15 is fully engaged in the end 23 of the integrated channel 16, the integrated compliant spring 17 is bent to take up tolerance slack-up and provide a force for engagement of the high-speed connectors 21 with the corresponding mating high-speed connectors 22.

Figure 15:
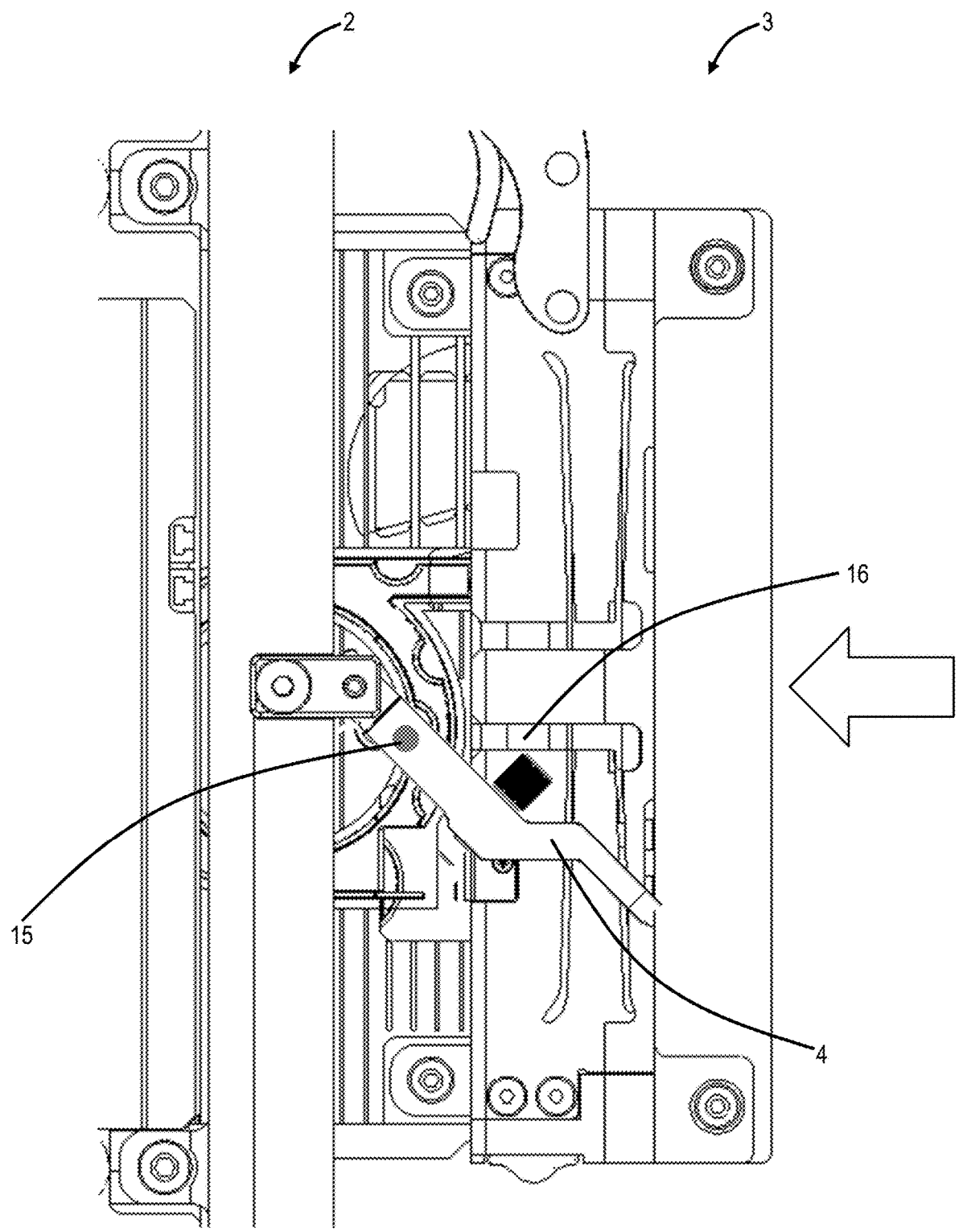
FIGS. 15-18 are diagrams illustrating the insertion of the sub-slot module into the module and the associated latching process.
Figure 16:
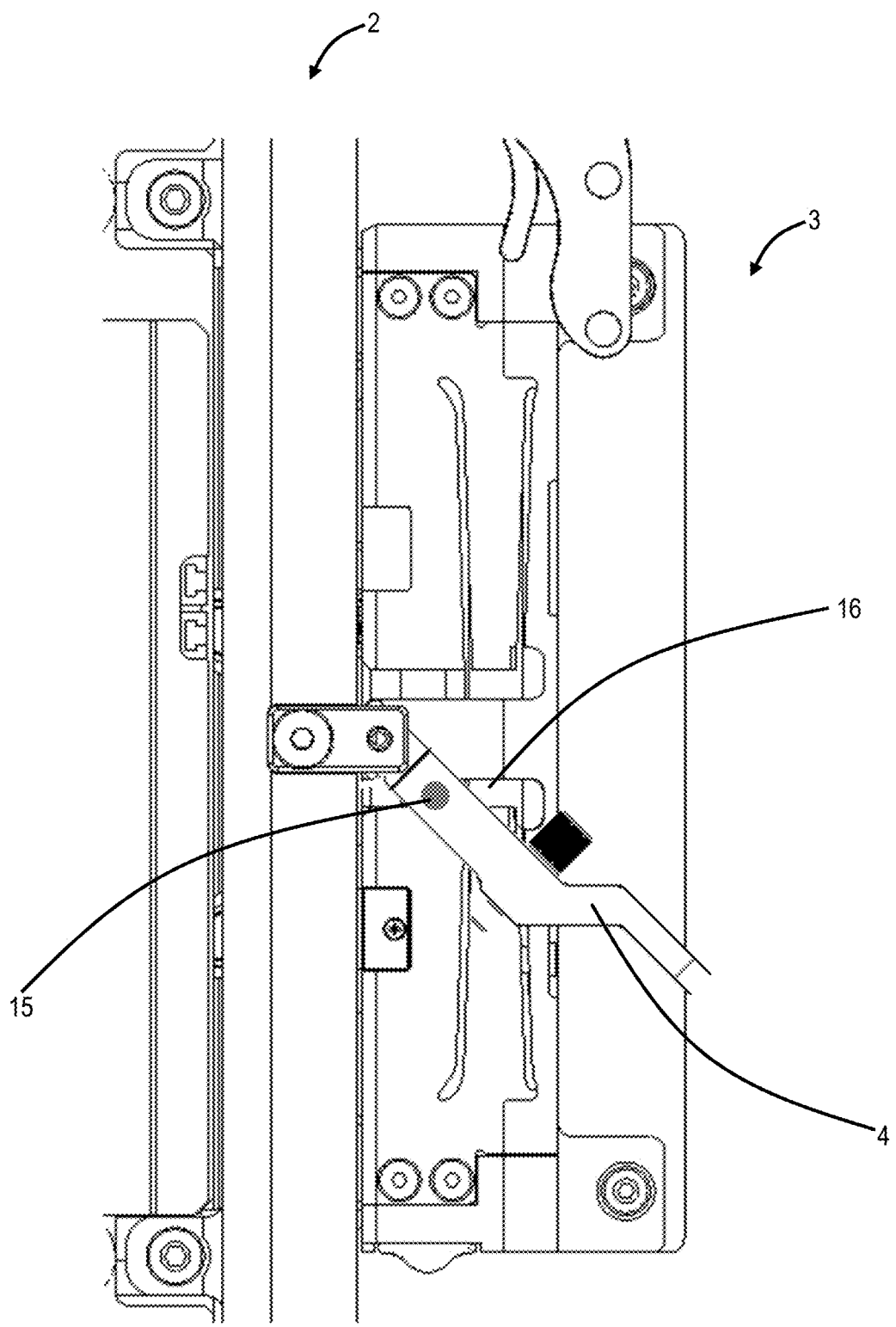
Figure 17:
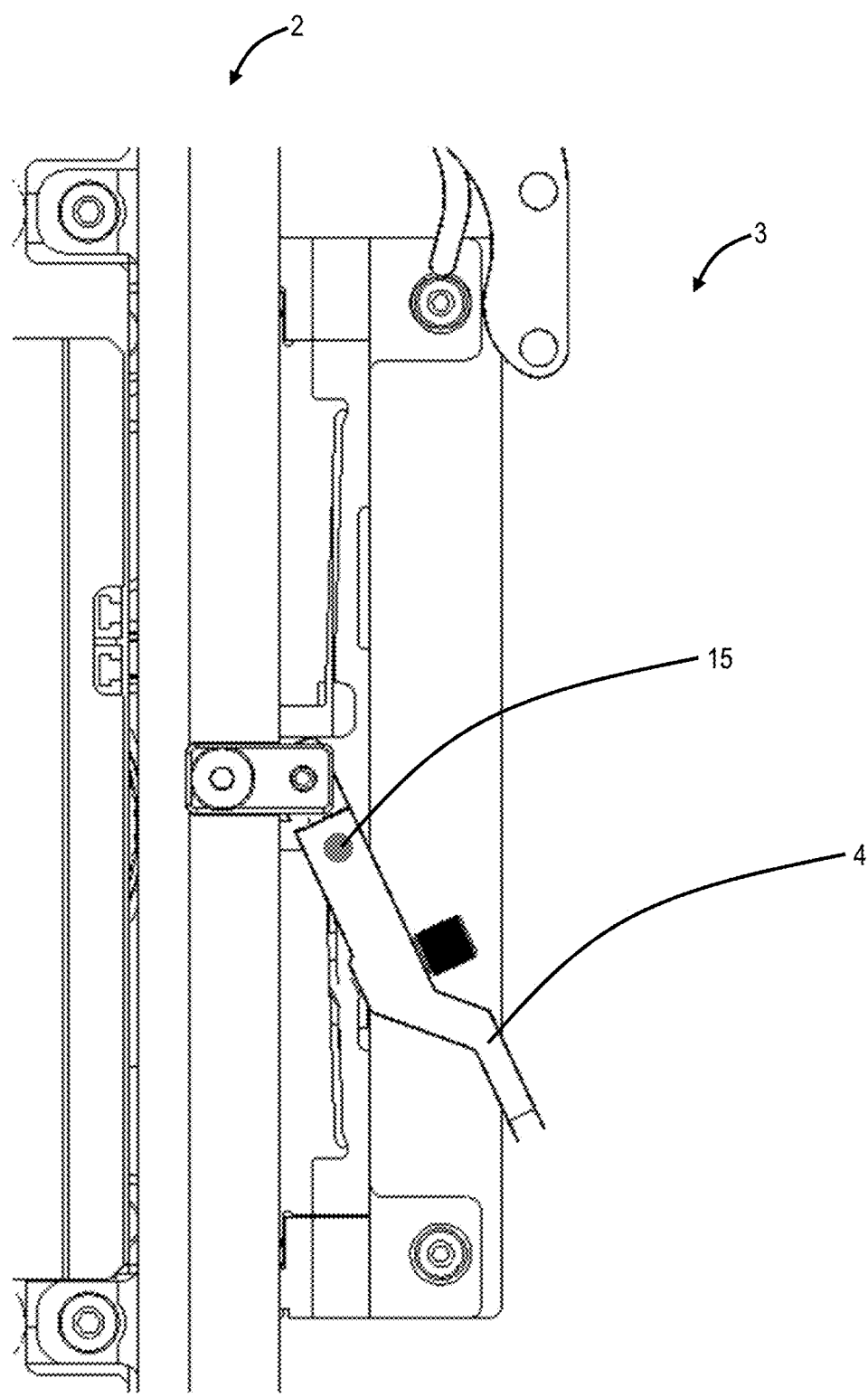
Figure 18:
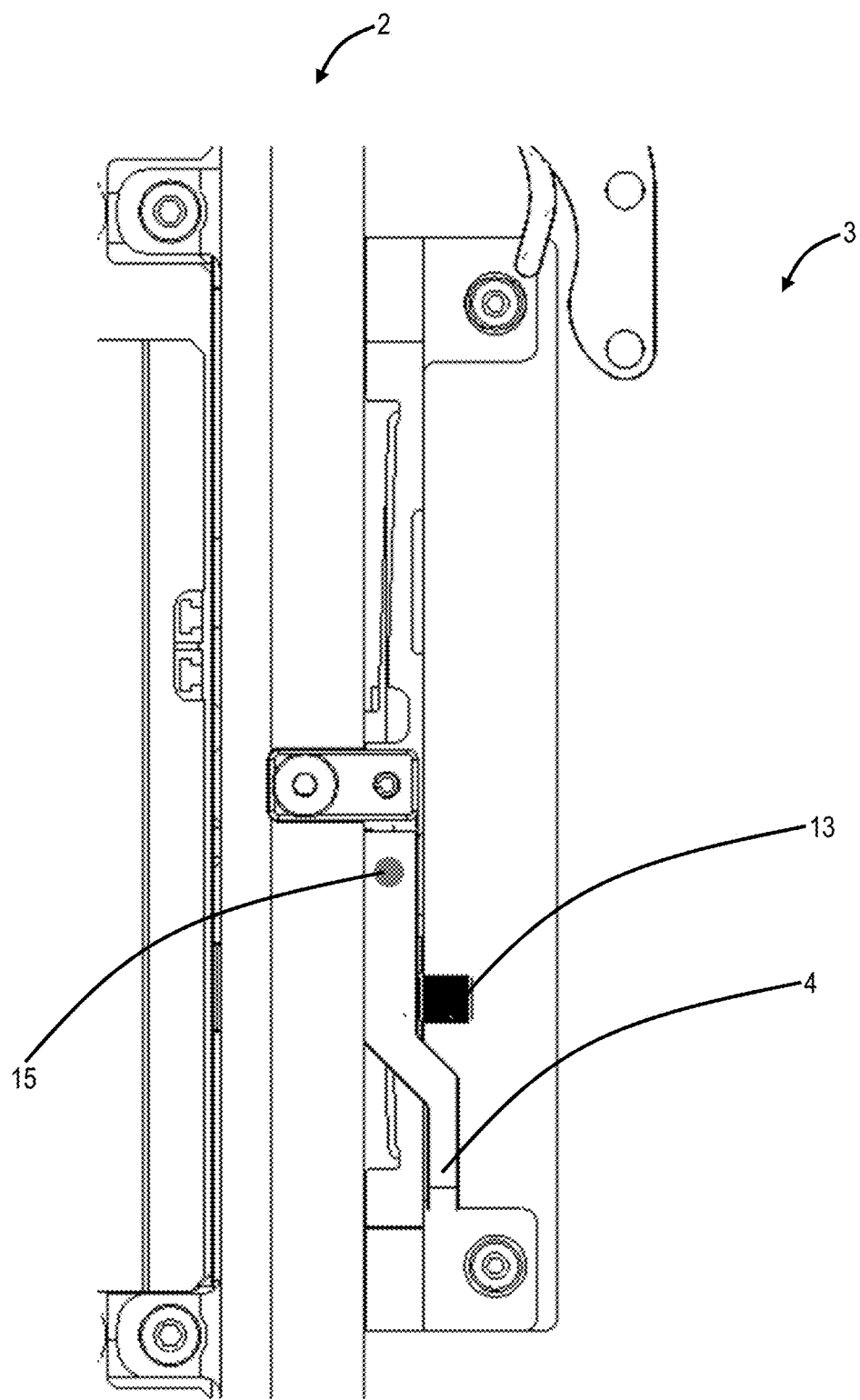

FIGS. 15-18 are diagrams illustrating insertion of the sub-slot module 3 into the module 2 and the associated latching process with the micro latch 4 and the compliant faceplate insert 5. Specifically, each of FIGS. 15-18 illustrate a top view of a front portion of the module 2 where the sub-slot module 3 is inserted, engaged, and ultimately latched with the micro latch 4. In FIG. 15, the sub-module 3 is initially inserted in the module 2, moving from right to left (direction of the arrow). At this point, the micro latch 4 is in the open position, i.e., not activated. The torsion spring 7 holds the micro latch 4 open to a about 45 degree via a hard stop 11. In this manner, the latching pin 15 on the micro latch 4 is aligned with the corresponding integrated channel 16, although not yet engaged.

In FIG. 16, the latching pin 15 engages the straight portion of the integrated channel as the sub-slot module 3 is slid into the module 2 while the micro latch 4 is still open. In FIG. 17, the sub-slot module 3 is almost fully inserted in the module 2. The latching pin 15 is at the end 23 of the integrated channel 16. Also, the high-speed connectors 21 engage the corresponding mating high-speed connectors 22. Between FIG. 17 and FIG. 18, the micro latch 4 is closed. As the micro latch 4 is closed, the sub-slot module 3 is fully pushed into and biased against the module 2. The integrated compliant spring 17 bends to take up the tolerance stack-up. The connectors 21, 22 are flush mated. The captive thumbscrew 13 is used to keep the micro latch 4 and module 3 in place, with the latching pin 15 locked in the end 23.

Figure 19:
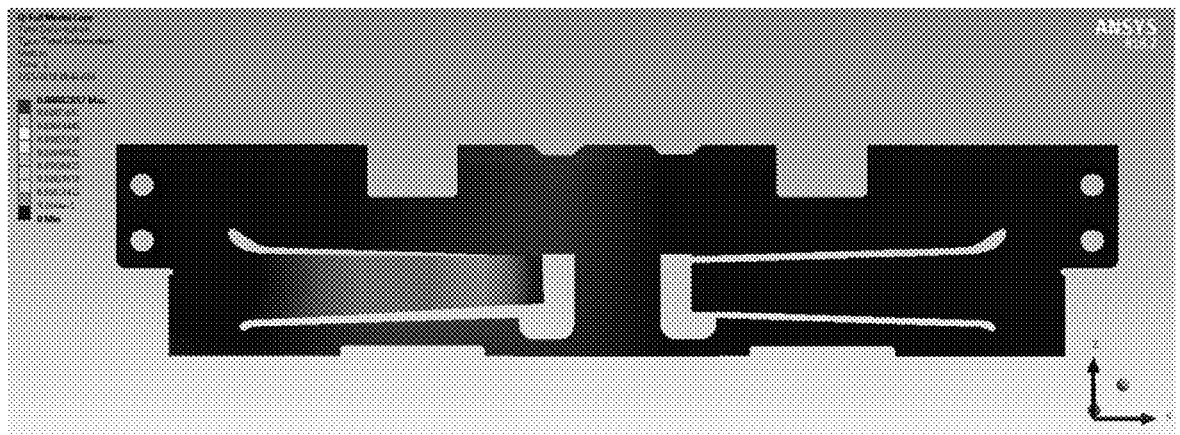
FIGS. 19-21 are diagrams of the compliant faceplate insert illustrating total deformation (FIG. 19), equivalent stress (FIG. 20), and safety factor (FIG. 21).
Figure 20:
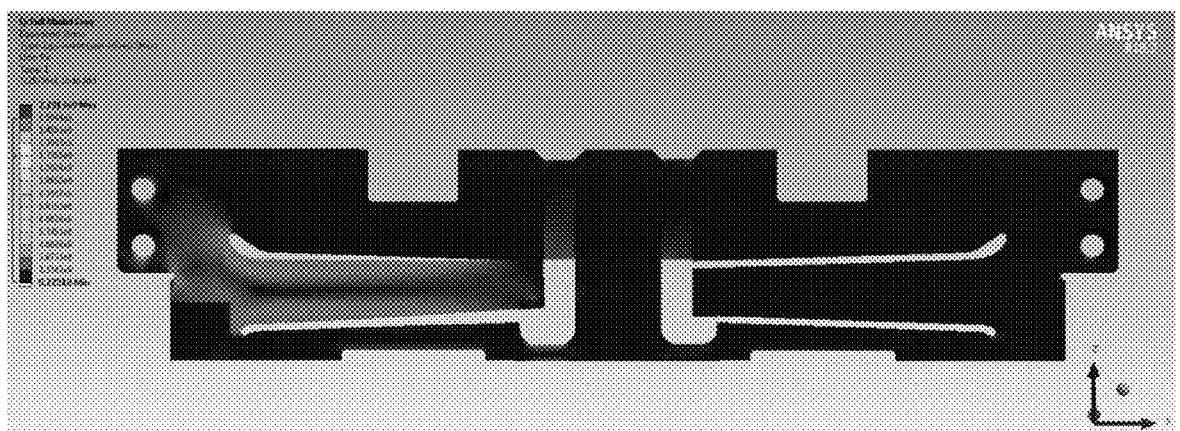
Figure 21:
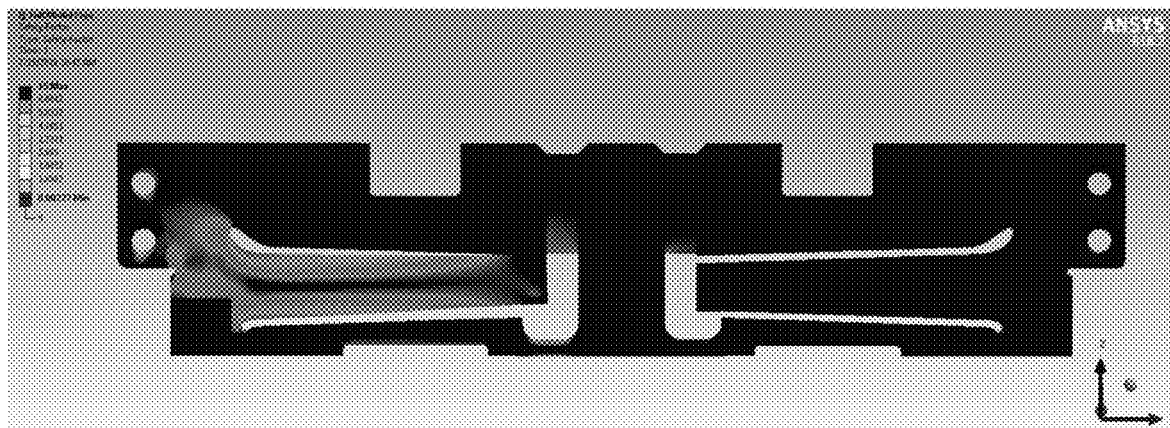

FIGS. 19-21 are diagrams of the compliant faceplate insert illustrating total deformation (FIG. 19), equivalent stress (FIG. 20), and safety factor (FIG. 21). All force is applied in a plane. The objective is to provide a thinnest compliant faceplate insert 5 which provides the appropriate force.

In an embodiment, a module 2 includes a physical form factor with one or more openings 45 in a faceplate 6 for receiving a corresponding sub-slot module 3; module high-speed connectors 22 configured to mate with high-speed connectors 21 in the corresponding sub-slot module 3; and one or more micro latches 4 for each of the one or more openings 45 to engage a compliant faceplate insert 5 on the corresponding sub-slot module 3, wherein a single micro latch 4 is utilized to engage a single sub-slot module 3 to provide a force sufficient to engage the high-speed connectors 21 with the module high-speed connectors 22.

Each of the one or more micro latches 4 includes a latching pin 15 which engages an integrated channel 16 in the compliant faceplate insert 5 on the corresponding sub-slot module 3 and which engages an end 23 of the integrated channel 16 to apply a force to a spring 17 on the compliant faceplate insert 5. The spring 17 on the compliant faceplate insert 5 can be a cantilever beam spring.

Each of the one or more micro latches 4 includes a thumbscrew 13 which engages a threaded insert 8 in the faceplate 6 of the module 2 for locking the corresponding micro latch 4 in place. Each of the one or more micro latches 4 includes a torsion spring 7 and a hard stop 11 which keeps the corresponding micro latch 4 open to about a 45-degree angle relative to the faceplate 6 in an open position. The force can be at least 40 lbs such that the engagement of the high-speed connectors 21 with the module high-speed connectors 22 is ±0.030".

Each of the one or more micro latches 4 can be stainless steel. Each of the one or more micro latches 4 can extend out no more than about 0.5" from the faceplate 6 in a closed position and wherein each of the one or more micro latches 4 can have a length of about 1.75".

In another embodiment, a network element system includes a shelf 1 configured to receive a plurality of modules 2; a module 2 of the plurality of modules; and a sub-slot module 3 configured to operate in the module 2, wherein the module 2 includes a physical form factor with an opening 45 in a faceplate 6 for receiving the sub-slot module 3; module high-speed connectors 22 configured to mate with high-speed connectors 21 in the sub-slot module 3; and a micro latch 4 for the opening 45 to engage a compliant faceplate insert 5 on the sub-slot module 3, wherein the micro latch 4 is a single latch utilized to engage the sub-slot module 3 to provide a force sufficient to engage the high-speed connectors 21 with the module high-speed connectors 22.

In a further embodiment, a process includes obtaining a module that includes a physical form factor with an opening in a faceplate, module high-speed connectors, and a micro latch for the opening; inserting a sub-slot module into the opening, wherein the sub-slot module includes compliant faceplate insert and high-speed connectors; engaging an integrated channel on the compliant faceplate insert with a latching pin on the micro latch; and closing the micro latch such that the latching pin engages an end of the integrated channel to provide a force sufficient to engage the high-speed connectors with the module high-speed connectors.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A module comprising: a physical form factor with one or more openings in a faceplate for receiving a corresponding sub-slot module; module high-speed connectors configured to mate with high-speed connectors in the corresponding sub-slot module; and one or more micro latches for each of the one or more openings to engage a compliant faceplate insert on the corresponding sub-slot module, wherein a single one of the one of more micro latches is utilized to engage a single the corresponding sub-slot module to provide physical compliancy with a biasing force sufficient to engage the high-speed connectors with the module high-speed connectors wherein each of the one or more micro latches includes a latching pin which engages an integrated channel in the compliant faceplate insert on the corresponding sub-slot module and which engages an end of the integrated channel to apply a force to a spring on the compliant faceplate insert.

2. The module of claim 1, wherein the spring on the compliant faceplate insert is a cantilever beam spring.

3. The module of claim 1, wherein each of the one or more micro latches includes a thumbscrew which engages a threaded insert in the faceplate of the module for locking the corresponding micro latch in place.

4. The module of claim 1, wherein each of the one or more micro latches includes a torsion spring and a hard stop which keeps the corresponding micro latch open to about a 45-degree angle relative to the faceplate in an open position.

5. The module of claim 1, wherein the force is at least 40 lbs such that the engagement of the high-speed connectors with the module high-speed connectors are fully mated and can accommodate a physical compliancy of ±0.030".

6. The module of claim 1, wherein each of the one or more micro latches is stainless steel.

7. The module of claim 1, wherein each of the one or more micro latches extends out no more than about 0.5" from the faceplate in a closed position and wherein each of the one or more micro latches has a length of about 1.75".

8. A module comprising:
a physical form factor with one or more openings in a faceplate for receiving a corresponding sub-slot module;
module high-speed connectors configured to mate with high-speed connectors in the corresponding sub-slot module; and
one or more micro latches for each of the one or more openings to engage a compliant faceplate insert on the corresponding sub-slot module,
wherein a single micro latch is utilized to engage a single sub-slot module to provide physical compliancy with a biasing force sufficient to engage the high-speed connectors with the module high-speed connectors,
wherein each of the one or more micro latches includes a thumbscrew which engages a threaded insert in the faceplate of the module for locking the corresponding micro latch in place.

9. A module comprising: a physical form factor with one or more openings in a faceplate for receiving a corresponding sub-slot module; module high-speed connectors configured to mate with high-speed connectors in the corresponding sub-slot module; and one or more micro latches for each of the one or more openings to engage a compliant faceplate insert on the corresponding sub-slot module, wherein a single one of the one of more micro latches is utilized to engage a single the corresponding sub-slot module to provide physical compliancy with a biasing force sufficient to engage the high-speed connectors with the module high-speed connectors, wherein each of the one or more micro latches includes a thumbscrew which engages a threaded insert in the faceplate of the module for locking the corresponding micro latch in place.

10. The module of claim 9, wherein the spring on the compliant faceplate insert is a cantilever beam spring.

11. The module of claim 8, wherein each of the one or more micro latches includes a torsion spring and a hard stop which keeps the corresponding micro latch open to about a 45-degree angle relative to the faceplate in an open position.

12. The module of claim 8, wherein the force is at least 40 lbs such that the engagement of the high-speed connectors with the module high-speed connectors are fully mated and can accommodate a physical compliancy of ±0.030".

13. The module of claim 8, wherein each of the one or more micro latches is stainless steel.

14. The module of claim 8, wherein each of the one or more micro latches extends out no more than about 0.5" from the faceplate in a closed position and wherein each of the one or more micro latches has a length of about 1.75".

15. A module comprising: a physical form factor with one or more openings in a faceplate for receiving a corresponding sub-slot module; module high-speed connectors configured to mate with high-speed connectors in the corresponding sub-slot module; and one or more micro latches for each of the one or more openings to engage a compliant faceplate insert on the corresponding sub-slot module, wherein a single one of the one of more micro latches is utilized to engage a single the corresponding sub-slot module to provide physical compliancy with a biasing force sufficient to engage the high-speed connectors with the module high-speed connectors, wherein each of the one or more micro latches includes a torsion spring and a hard stop which keeps the corresponding micro latch open to about a 45-degree angle relative to the faceplate in an open position.

16. The module of claim 15, wherein each of the one or more micro latches includes a latching pin which engages an integrated channel in the compliant faceplate insert on the corresponding sub-slot module and which engages an end of the integrated channel to apply a force to a spring on the compliant faceplate insert.

17. The module of claim 15, wherein each of the one or more micro latches includes a thumbscrew which engages a threaded insert in the faceplate of the module for locking the corresponding micro latch in place.

18. The module of claim 15, wherein the force is at least 40 lbs such that the engagement of the high-speed connectors with the module high-speed connectors are fully mated and can accommodate a physical compliancy of ±0.030".

19. The module of claim 15, wherein each of the one or more micro latches is stainless steel.

20. The module of claim 15, wherein each of the one or more micro latches extends out no more than about 0.5" from the faceplate in a closed position and wherein each of the one or more micro latches has a length of about 1.75".

* * * * *